United States Patent [19]
Suzuki et al.

[11] Patent Number: 6,163,713
[45] Date of Patent: Dec. 19, 2000

[54] HIGH FREQUENCY TRANSMISSION LINE CAPABLE OF IMPROVING AN INTERMODULATION DISTORTION CHARACTERISTIC IN A HIGH FREQUENCY DEVICE

[75] Inventors: Katsumi Suzuki; Sadahiko Miura; Takayuki Inoue; Koji Muranaka; Hideaki Zama; Youichi Enomoto; Tadataka Morishita; Shoji Tanaka, all of Tokyo, Japan

[73] Assignees: NEC Corporation, Tokyo; Sumitomo Electric Industries, Ltd., Osaka; International Superconductivity Technology Center, Tokyo, all of Japan

[21] Appl. No.: 09/035,366

[22] Filed: Mar. 5, 1998

[30] Foreign Application Priority Data

Mar. 7, 1997  [JP]  Japan ........................ 9-52711

[51] Int. Cl.[7] .............................. H01P 3/08; H01B 12/02
[52] U.S. Cl. .................. 505/210; 333/99 S; 333/238; 505/700; 505/701; 505/866
[58] Field of Search ...................... 333/219, 238, 333/246, 995; 505/210, 700, 701, 866

[56] References Cited

U.S. PATENT DOCUMENTS

5,070,072  12/1991  Mir et al. ............................. 505/701 X
5,219,827  6/1993  Higaki et al. ...................... 333/99 S X

FOREIGN PATENT DOCUMENTS

7-33590  2/1995  Japan .

*Primary Examiner*—Benny T. Lee
*Attorney, Agent, or Firm*—Laff, Whitesel & Saret, Ltd.; J. Warren Whitesel

[57] ABSTRACT

In a high frequency transmission line having a dielectric substrate and a conductor line which is provided on the dielectric substrate for allowing electric current to flow therethrough, the conductor line has a non-grain-boundary oxide superconductor layer with twin walls but without grain boundaries. The high frequency transmission line is in the form of a plane circuit. It is preferable that an oriented oxide superconductor layer is provided between the dielectric substrate and the non-grain-boundary oxide superconductor layer.

10 Claims, 3 Drawing Sheets

6,163,713

HIGH FREQUENCY TRANSMISSION LINE CAPABLE OF IMPROVING AN INTERMODULATION DISTORTION CHARACTERISTIC IN A HIGH FREQUENCY DEVICE

BACKGROUND OF THE INVENTION

The present invention relates to a high frequency transmission line for transmitting a high frequency signal, a resonator having the high frequency transmission line, and a high frequency device having the resonator.

This invention deals with intermodulation distortion which refers to the family of system performance impairments caused by the nonlinear transfer characteristic of a broadband system, which produces spurious output signals (called "intermodulation products") at frequencies that are linear combinations of those of the input. The system output ($S_O$) can generally be related to the system input by the transfer equation:

$$S_O = AS_i + BS_i^2 + CS_i^3 AS_i = \text{the fundamental signal term}$$

The terms $BS_i^2$ and $BS_i^2$ represent the second order and third-order distortion terms, respectively. As shown in FIG. 3, the second order term produces a second harmonic frequency component for every input signal frequency and intermodulation frequency components of the form $f_1 \pm f_2$. The third-order term produces a third harmonic frequency and intermodulation frequency components of the form $f_1 \pm f_2 \pm f_3$ and $2f_1 \pm f_2$. Third-order distortion also produces cross-modulation where modulation of one carrier can appear on another carrier on the system even when the second carrier is unmodulated when input into the system.

For convenience of expression, the term "twin walls" is used herein to describe a superconductor layer made of $LnBa_2Cu_3O_x$ crystals. More particularly, a non-grain boundary oxide superconductor layer can be made of $LnBa_2Cu_3O_x$ crystals having an orthorhombic system in the crystal structure. A rectangular parallelepiped crystal has lattice spaces a, b and c extending in x, y, and z directions, respectively. The lattice spaces a, b, and c are not equal to one another in the orthorhombic system. It will be assumed as a particular condition that two $LnBa_2Cu_3O_x$ crystals are in contact with each other and are coincident with each other in the z direction while they are alternated with each other in the x and the y directions. In this particular condition, the crystals have a twin boundary therebetween, as is known in the art. Therefore, the contact is called "twin walls" throughout the following specification. The term "twin boundary" could also be used to describe the non-grain-boundary.

Recently, the mobile communication field is one of the fast-growing industrial fields where users have been doubled year by year. Following this, there have been such demands in the mobile communication field that as many users as possible can receive services under the excellent communication conditions without interference in the limited range of frequency allocation. For achieving this, in the mobile communication system using microwaves of, for example, about 0.8 GHz to 3 GHz, it is required that characteristics of resonators and filters used in base stations of the system be excellent. However, it has been difficult to satisfy such requirements by the conventional resonators or filters using gold or copper for conductor lines Under these circumstances, attention has been directed to an adoption of superconductivity techniques. For example, there has been proposed a technique (hereinafter referred to as "prior art 1") which applies a thin or thick film made of $RBa2Cu3Ox$ (R represents Y or one other element of the lanthanide series element, such as Nd, and x represents an amount of oxygen. Hereinafter, this compound will be referred to as "Y-123 type crystal oxide") having a 123 type crystal structure as being an oxide superconductor, to a conductor line in a high frequency transmission line in the form of a plane circuit having a microstrip structure, a coplanar structure, a stripline structure or the like.

It is considered that when the Y-123 type crystal oxide is used for the conductor line in the high frequency device according to the prior art 1, the characteristic of the foregoing resonator or filter can be improved as compared with using gold or copper. This is because the oxide superconductor is small in high frequency resistance.

In the prior art 1, a thin film made of Y-123 type crystal oxide and applied to a conductor line is formed to be about 0.5 μm thick by a method of laser ablation or sputtering. On the other hand, a thick film made of Y-123 type crystal oxide is formed by a method in which a material dissolved in an organic solvent is hardened on a substrate. According to this method, a thick film not less than about 10 μm in thickness can be easily formed.

On the other hand, there has been a problem about an intermodulation distortion characteristic, as one of high frequency characteristics, in the resonator or the filter which is applied with the thin or thick film of Y-123 type crystal oxide formed according to the prior art 1.

It is well known that when the intermodulation distortion is increased in the high frequency devices, such as the resonators or the filters, interference is, in general, immediately caused in the communication system using those high frequency devices. As described above, the foregoing technique is applied to the resonators or the filters for the purpose of allowing as many users as possible to receive the services under the excellent communication conditions without interference in the limited range of frequency allocation. Therefore, it is necessary to suppress the intermodulation distortion in the high frequency device to be small, that is, the intermodulation distortion characteristic should be improved.

In view of the foregoing, there has been proposed a technique (hereinafter referred to as "prior art 2") which aims to improve the intermodulation distortion characteristic by controlling the size of grain boundaries in a thin or thick film made of Y-123 type crystal oxide. As appreciated, the intermodulation distortion represents a non-linear distortion where an output signal including frequency components equal to the sums and differences between integer-times input frequency components appears, and the intermodulation distortion characteristic represents a characteristic thereof.

However, the high frequency transmission line formed according to the prior art 2 has the following problem upon being applied to the resonator or the filter as the high frequency device:.

Specifically, as described above, a lot of grain boundaries are included in the thin or thick film of Y-123 type crystal oxide formed according to the prior art 2. As a result, the surface of the thin or thick film is degraded in flatness to have irregularities thereon. This means that a corresponding transmission line is extended. Thus, the resistance is increased to enlarge a transmission loss particularly when the large power is inputted.

Further, although some evaluation results about the high frequency resistance and the high power characteristic according to the prior art 2 have been announced, the reliable experimental data have not yet been obtained so that reduction to practical use is still not possible.

Accordingly, since even the prior art 2, not to mention the other techniques, is not applicable, there have been no techniques available which can improve the intermodulation distortion characteristic in the high frequency device to suppress the harmonic distortion.

SUMMARY OF THE INVENTION

It is therefore an object of the present invention to provide a high frequency transmission line which is capable of improving an intermodulation distortion characteristic in a high frequency device.

It is another object of the present invention to provide a resonator having the high frequency transmission line and a high frequency device having the resonator.

Upon solving the foregoing problems, the present inventors have concluded that the intermodulation distortion is increased due to a material characteristic of the oxide superconductor. Specifically, they have concluded that the existence itself of a very large number of the grain boundaries included in the oxide superconductor formed by the prior art enlarges the intermodulation distortion. Therefore, the present invention aims not to control the size of the grain boundaries but to eliminate the grain boundaries for improving the intermodulation distortion characteristic. If the grain boundaries are eliminated, the irregularities on the surface, which have been the problem in the prior art 2, can be suppressed and further the intermodulation at distortion characteristic can be improved. For obtaining an oxide superconductor with no grain boundaries included, the present invention utilizes a crystal film producing method disclosed in JP-A-7-33590.

According to one aspect of the present invention, there is provided a high frequency transmission line in the form of a plane circuit, comprising a dielectric substrate and a conductor line provided on the dielectric substrate for allowing electric current to flow therethrough, the conductor line comprising a non-grain-boundary oxide superconductor layer with twin walls but without grain boundaries.

According to another aspect of the present invention, there is provided a resonator comprising a high frequency transmission line in the form of a plane circuit, the high frequency transmission line comprising a dielectric substrate and a conductor line provided on the dielectric substrate for allowing electric current to flow therethrough, the conductor line comprising a non-grain-boundary oxide superconductor layer with twin walls but without grain boundaries.

According to still another aspect of the present invention, there is provided a high frequency device comprising a resonator comprising a high frequency transmission line in the form of a plane circuit, the high frequency transmission line comprising a dielectric substrate and a conductor line provided on the dielectric substrate for allowing electric current to flow therethrough, the conductor line comprising a non-grain-boundary oxide superconductor layer with twin walls but without grain boundaries.

DESCRIPTION OF THE PREFERRED EMBODIMENT

Now, a resonator comprising a high frequency transmission line according to a preferred embodiment of the present invention will be described with reference to the accompanying drawings. In the preferred embodiment, a high frequency transmission line is in the form of a plane circuit having a microstrip structure known in the art.

Figure 1:
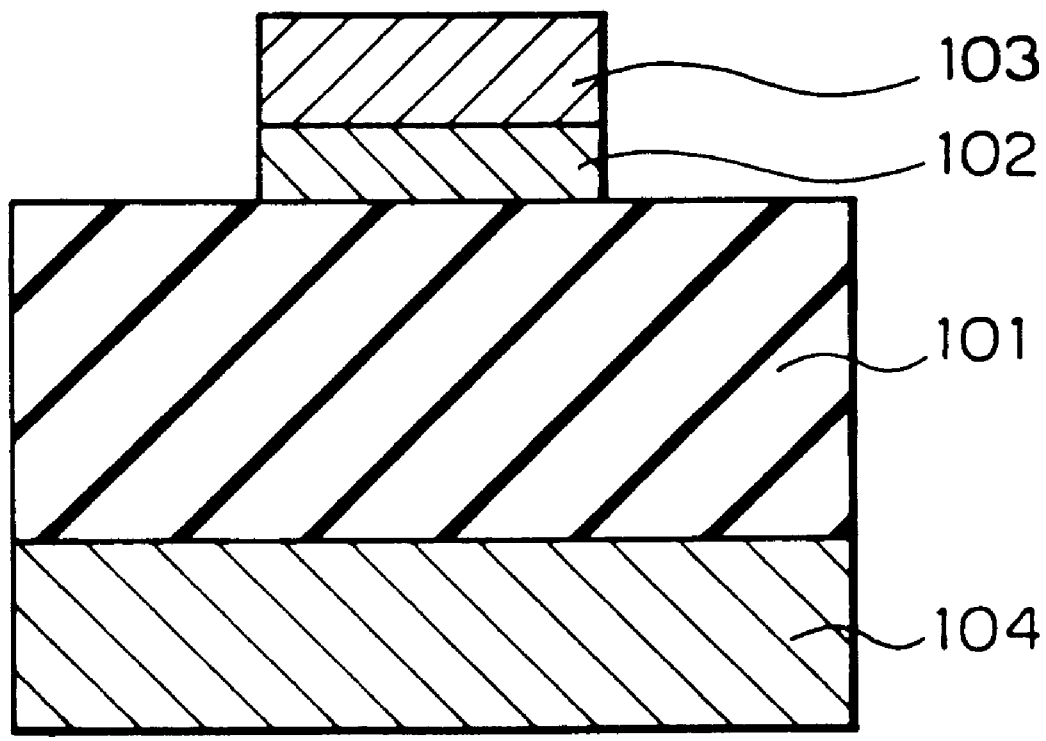
FIG. 1 is a sectional view showing a structure of a high frequency transmission line according to a preferred embodiment of the present invention.

FIG. 1 is a sectional view showing a structure of a resonator comprising a high frequency transmission line according to the preferred embodiment. The sectional view is-used for best explaining the microstrip structure.

As shown in FIG. 1, the high frequency transmission line comprises a magnesia single crystal substrate 101 as a dielectric substrate, an oriented Y-123 crystal film 102 and a non-grain-boundary Y-123 crystal film 103 which cooperatively form a conductor line, and an oriented Y-123 crystal film 104 as a ground conductor plate. As FIG. 1 clearly shows, the non-grain-boundary 103 has a thickness which is not less than one-half of the thickness of the layers 102 and 103 which cooperate to form the conductor line. The Y-123 crystal film represents a crystal film made of an oxide superconductor (hereinafter referred to as "Y-123") of $YBa_2Cu_3O_x$ having a 123 type crystal structure, where x represents an amount of oxygen. Further, the oriented Y-123 crystal film represents an oriented film made of Y-123, and the non-grain-boundary Y-123 crystal film represents a crystal film made of Y-123 having twin walls but no grain boundaries. As appreciated, these terms are used only for simplifying explanation. Thus, no limitation exists in term itself, and these terms cover those having the same contents in view of the definitions of them, respectively.

The oriented Y-123 crystal film 102 is formed on the surface of the magnesia single crystal substrate 101 using, for example, a laser ablation method, and the non-grain-boundary Y-123 crystal film 103 is grown on the oriented Y-123 crystal film 102 from the liquid phase. Further, the oriented Y-123 crystal film 102 and the non-grain-boundary Y-123 crystal film 103 are patterned to form a conductor line.

As described above, the magnesia single crystal substrate 101 is an electrically insulating dielectric. Thus, on a surface of the magnesia single crystal substrate 101 remote from a surface thereof having the oriented Y-123 crystal film 102 and the non-grain-boundary Y-123 crystal film 103, the oriented Y-123 crystal film 104 is formed by the laser ablation method to work as a ground plane.

As described above, the high frequency transmission line in this embodiment comprises the dielectric substrate, the conductor line formed on the dielectric substrate, and the ground conductor plate formed on the surface of the dielectric substrate remote from the surface thereof provided with the conductor line and, as appreciated from FIG. 1, it has the microstrip structure.

Now, a method of fabricating the high frequency transmission line according to this embodiment will be described.

First, the magnesia single crystal substrate 101 is increased in temperature to 750° C., then the oriented Y-123 crystal film 102 is formed to be 0.1 μm thick on the magnesia single crystal substrate 101 by the laser ablation method in the normal oxygen atmosphere.

Subsequently, using the oriented Y-123 crystal film 102 as an intermediate layer, the non-grain-boundary Y-123 crystal film 103 is grown on the oriented Y-123 crystal film 102 by primary crystals from the liquid phase using a mixed solution of BaO and CuO.

More specifically, an yttria crucible made of yttria is provided, then $Y_2BaCuO_5$ (solid phase precipitate) is put into the yttria crucible at a lower part thereof as a solute feed substance, and further, a mixed solution of BaO and CuO is put into the yttria crucible at an upper part thereof as a solvent. The BaO-CuO mixed solution is prepared by mixing barium carbonate and copper oxide so as to obtain a mixture of 3:5 in mole ratio of Ba and Cu, then by calcining the mixture at 880° C. for 40 hours. Thereafter, the crucible containing the solute and the solvent is heated to about 1,000° C. so as to melt the solvent. At this stage, $Y_2BaCuO_5$ being the solute feed substance is precipitated at the lower part in the yttria crucible while the mixture of BaO and CuO being the solvent is held in the liquid state at the upper part of the yttria crucible. In this state, the oriented Y-123 crystal film 102 is brought in touch with the liquid-phase portion as seeds, then the yttria crucible is lowered in temperature by about 20° C., and then the oriented Y-123 crystal film 102 along with the magnesia single crystal substrate 101 are raised in an upward direction seen from the yttria crucible at 0.2 μm per hour and at 100 rpm, so that the non-grain-boundary crystal film 103 can be formed on the oriented Y-123 crystal film 102 by primary crystals from the liquid phase.

Subsequently, on the surface of the magnesia single crystal substrate 101 remote from the surface where the oriented Y-123 crystal film 102 and so on are provided, the oriented Y-123 crystal film 104 is formed in the following manner: Specifically, the magnesia single crystal substrate 101 is increased in temperature to 750° C., then the oriented Y-123 crystal film 104 is formed to be 0.5 μm thick on the magnesia single crystal substrate 101 by the laser ablation method in the normal oxygen atmosphere.

After the formation of the oriented Y-123 crystal film 104, a gold film is formed to be 0.1 μm thick on the non-grain-boundary Y-123 crystal film 103 grown from the liquid phase, using an argon sputtering method. Then, photoresists are applied to the surfaces of the gold film and the oriented Y-123 crystal film 104. Then, like the normal photoprint method using a photomask, the photoresist on the gold film is patterned like the photomask. The photoresist provided on the surface of the oriented Y-123 crystal film 104 is of a type which is not removed through a developing process. The photoresist is provided on the surface of the oriented Y-123 crystal film 104 for protecting the oriented Y-123 crystal film 104 in a later etching process. Thus, the photoresist may be applied to the surface of the oriented Y-123 crystal film 104 after the developing process.

Thereafter, dry etching is carried out relative to the gold film using the patterned photoresist on the gold film as a mask so that the gold film is patterned according to the-pattern of the photoresist.

Then, using the patterned photoresist and gold film as an etching mask, chemical etching is carried out relative to the oriented Y-123 crystal film 102 and the non-grain-boundary Y-123 crystal film 103 using a 0.1% hydrochloric acid aqueous solution so as to expose the surface of the magnesia single crystal substrate 101. In this manner, the oriented Y-123 crystal film 102 and the non-grain-boundary Y-123 crystal film 103 are patterned. As appreciated, instead of the hydrochloric acid aqueous solution, what has a like etching rate may be used.

Thereafter, the photoresist on the gold film and the photoresist on the oriented Y-123 crystal film 104 are removed by oxygen plasma. Finally, the exposed gold film is removed by dry etching so as to expose the non-grain-boundary Y-123 crystal film 103.

Through the foregoing processes, the high frequency transmission line having the sectional structure as shown in FIG. 1 can be fabricated.

The non-grain-boundary crystal film 103 obtained through the foregoing processes has a mirror finished surface. The results of observation by a polarizing microscope show that the thus obtained non-grain-boundary crystal film 103 has excellent crystallinity with twin walls but without grain boundaries.

Hereinbelow, the results of comparison about high frequency characteristics between the high frequency transmission line according to this embodiment and the conventional high frequency transmission line will be shown. As high frequency devices having the respective high frequency transmission lines, microstrip resonators were used.

The conventional microstrip resonator had the following structure: From the structure shown in FIG. 1, the non-grain-boundary Y-123 crystal film 103 was omitted. Accordingly, a conductor line was in the form of a monolayer oxide superconductor. Further, the oriented Y-123 crystal film 102 forming the conductor line had a thickness of 0.3 μm, Moreover, instead of the oriented Y-123 crystal film 104, a gold film having a thickness of 3 μm was used and worked as a ground conductor plate. Hereinbelow, this structure will be called the conventional structure.

To obtain the accurate comparison results, the microstrip resonator according to this embodiment also used a 3 μm thick gold film instead of the oriented Y-123 crystal film 104 shown in FIG. 1.

Further, in the microstrip resonators of the conventional structure and this embodiment, magnesia single crystal substrates as dielectric substrates had the same thickness, and patterns of conductor lines formed on the magnesia single crystal substrates had the same size. A resonance pattern of each conductor line was a pattern having a straight portion of a length half an effective resonance wavelength and coupled by a gap capacity. Specifically, the microstrip resonators to be compared were so-called standard linear half wavelength microstrip resonators, respectively.

As a result of matching the conditions as described above, resonance frequencies, no-load Q values and insertion losses were within error of 1% between the conventional structure and the structure according to this embodiment at the same operating temperature of 25K and with sufficiently small microwave inputs, and were 10.7 GHz, 2,500 and 5.6 dB, respectively.

This means that the input/output characteristics relative to the microwave can also be compared on the order of 1% error. Specifically, when the microwave inputs are gradually increased to compare the intermodulation distortion characteristics being the output characteristics, the comparison can be achieved on the order of 1% error without conversion of the microwave input power per resonator.

Figure 2:
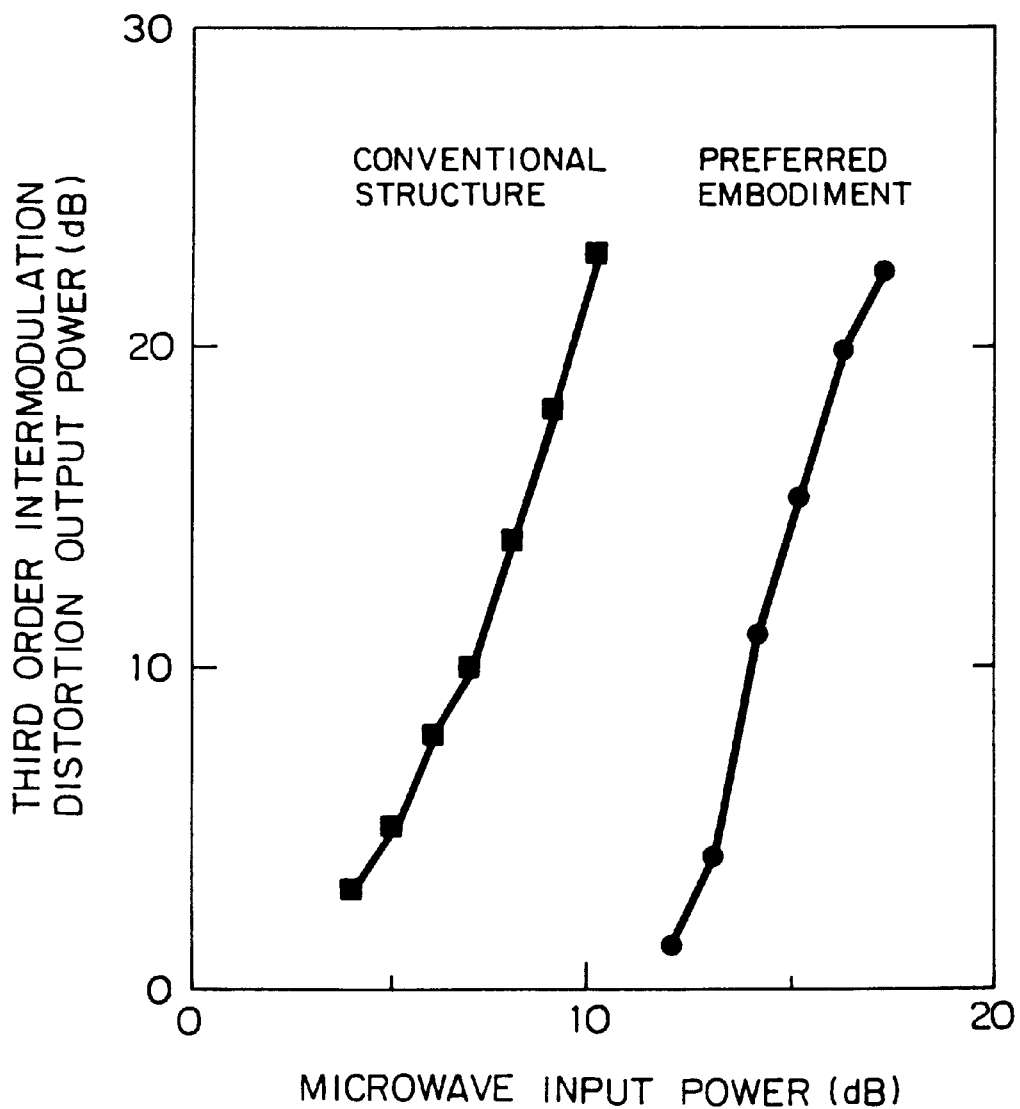
FIG. 2 is a diagram showing the results of comparison about high frequency characteristic between a structure according to the preferred embodiment of the present invention and a conventional structure.

FIG. 2 shows the results of comparison about third order intermodulation distortion characteristics between the conventional structure and the structure of this embodiment. In FIG. 2, the abscissa represents the input power, while the ordinate represents the third order intermodulation distortion output power. Referring to FIG. 2, the output power is increased by the cube of the input power both in the conventional structure and the structure of this embodiment. This means that it is induced by the third harmonic distortion. On the other hand, in the structure of this embodiment, the third order intermodulation distortion output power is smaller by about 30 dB as compared with the conventional structure. In other words, this means that under the condition of the same third order intermodulation distortion output power, the structure of this embodiment has the microwave power greater by 10 dB than the conventional structure. The foregoing concerns the input power. As to the output characteristic, since the comparison can be achieved on the order of 1% error as described above, the foregoing 10 dB represents a ten-times improvement in characteristic. As appreciated from this, according to this embodiment, the intermodulation distortion characteristic can be largely improved.

Since the third order intermodulation distortion characteristic shown in FIG. 2 is a special conception, further explanation will be made with reference to FIG. 3 for better understanding.

Figure 3:
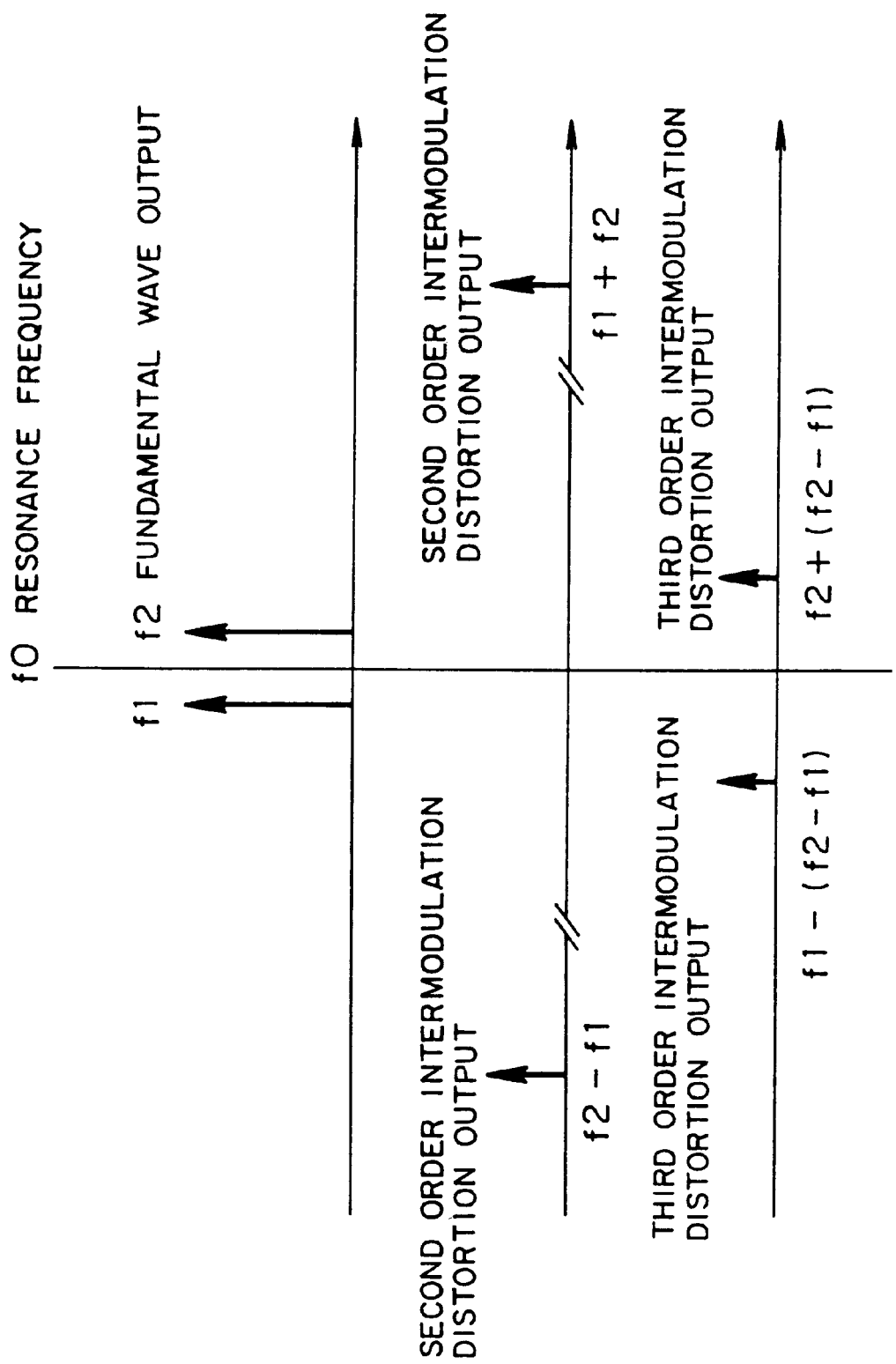
FIG. 3 is a diagram for explaining third order intermodulation distortion.

Assuming that two microwaves having fundamental wave output frequencies f1 and f2 (f1−f0=−0.5 MHz, f2−f0=0.5 MHz, where f0 represents a resonance frequency and is set to about 10.7 GHz in FIG. 3) are inputted, the third order intermodulation distortion characteristic represents a strength characteristic of signals outputted at frequencies deviating 1 MHz from f1 and f2 in directions away from f0, respectively.

The reason why it is called "third order" is that the frequencies deviating 1 MHz from f1 and f2 are generated by the third harmonic. Such frequencies have a value obtained by subtracting f2 from double [f1(f2−f1)] f1 and a value obtained by subtracting f1 from double f2 [f2+(f2−f1)], respectively. These signals do not appear when a measuring device accomplishes a fully linear response, so that less values thereof represent a better characteristic of a device, such as a resonator or a filter, which requires a linear response.

Accordingly, by using the device with the excellent distortion characteristic as provided in this embodiment, when traffic channels are used at intervals of, for example, 1 MHz, excellent services without interference can be offered to users using traffic channels at frequencies deviating 1 MHz from the foregoing f1 and f2, respectively.

As described above, when the high frequency transmission line having the structure of this embodiment is applied to the high frequency device, not only the practicality is ensured, but also the intermodulation distortion characteritic is improved to achieve improvement in characteristic over the whole harmonic distortion as compared with the conventional structure.

In this embodiment, the high frequency transmission line is in the form of the plane circuit having the microstrip structure. However, the present invention is not limited thereto. Specifically, the plane circuit may have a structure other than the microstrip structure, such as a coplanar structure or a stripline structure.

In the foregoing comparison, the resonance frequency of the resonator is set to about 10 GHz. However, the present invention is not limited thereto. Further, the high frequency device to be applied with the high frequency transmission line of the present invention is not limited to the resonator and may also be, for example, a filter constituted by a combination of resonators, or an oscillator or amplifier including a resonator or filter as a constituent circuit. As appreciated, effects similar to the foregoing can be achieved even in those high frequency devices.

In this embodiment, the oriented Y-123 crystal film 102 (see FIG. 1) as the intermediate layer and the oriented Y-123 crystal film 104 (see FIG. 1) as the ground conductor plate are formed by the laser ablation method. However, the present invention is not limited thereto, and other methods may be used for forming them.

With respect to the non-grain-boundary oxide superconductor (the non-grain-boundary Y-123 crystal film 103 in the embodiment) to be used at the conductor line, it is possible that local and isolated grain boundaries may invade into the non-grain-boundary oxide super-conductor in view of the forming technique. However, this is only based on the early technology and included in the concepts of the present invention. The thickness of the non-grain-boundary oxide superconductor layer is not less than 0.3 $\mu$m.

In this embodiment, with respect to RB2Cu3Ox having the 123 type crystal structure, R is explained to be Y (yttrium). However, R may also be one other element of the lanthanide series element, such as Nd.

Further, instead of the oriented Y-123 crystal film 104 (see FIG. 1) as the ground conductor plate, a monolayer film of normal metal, such as gold or copper, or a multilayer film in combination of Ti (titanium), Cr (chromium) or the like and the normal metal for enhancing adhesiveness between the metal and the dielectric substrate, may be used.

Further, instead of the oriented Y-123 crystal film 104 (see FIG. 1) as the ground conductor plate, a multilayer film in combination of the oriented Y-123 crystal film and the non-grain-boundary Y-123 crystal film similar to the conductor line may be used.

As described above, according to the preferred embodiment of the present invention, the high frequency transmission line which is practical and improved in harmonic distortion characteristic can be obtained.

Further, by applying such a high frequency transmission line, the high frequency device, such as the resonator, having a characteristic of small harmonic distortion can be obtained.

What is claimed is:

1. A high frequency transmission line in the form of a plane circuit, comprising a dielectric substrate and a conductor line provided on said dielectric substrate for allowing electric current to flow therethrough, said conductor line comprising:

a non-grain-boundary oxide superconductor layer with twin walls but without grain boundaries; and an oriented oxide superconductor layer between said dielectric substrate and said non-grain-boundary oxide superconductor layer, said non-grain-boundary oxide superconductor layer having a thickness not less than half a thickness of said conductor line.

2. A high frequency transmission line as claimed in claim 1, wherein said non-grain-boundary oxide superconductor layer is comprised of crystals of $RBa_2Cu_3O_x$ having a 123 type crystal structure, where R represents Y or one other element of the lanthanide series, x representing an amount of oxygen.

3. A high frequency transmission line as claimed in claim 2, wherein said non-grain-boundary oxide superconductor layer is fabricated by primary crystals from a liquid phase.

4. A high frequency transmission line as claimed in claim 1, wherein the thickness of said non-grain-boundary oxide superconductor layer is not less than 0.3 $\mu$m.

5. A high frequency transmission line as claimed in claim 1, wherein said non-grain-boundary oxide superconductor layer is comprised of crystals of $RBa_2Cu_3O_x$ having a 123 type crystal structure, said oriented oxide superconductor layer being comprised of crystals of $RBa_2Cu_3O_x$ having an oriented 123 type crystal structure, where R represents Y or one other element of the lanthanide series, x representing an amount of oxygen.

6. A resonator comprising a high frequency transmission line in the form of a plane circuit, said high frequency transmission line comprising a dielectric substrate and a conductor line provided on said dielectric substrate for allowing electric current to flow therethrough, said conductor line comprising:

a non-grain-boundary oxide superconductor layer with twin walls but without grain boundaries; and an oriented oxide superconductor layer between said dielectric substrate and said non-grain-boundary oxide superconductor layer, said non-grain-boundary oxide superconductor layer having a thickness not less than half a thickness of said conductor line.

7. A resonator as claimed in claim 6, wherein the thickness of said non-grain-boundary oxide superconductor layer is not less than 0.3 $\mu$m.

8. A resonator as claimed in claim 6, wherein said non-grain-boundary oxide superconductor layer is comprised of crystals of $RBa_2Cu_3O_x$ having a 123 type crystal structure, where R represents Y or one other element of the lanthanide series, x representing an amount of oxygen.

9. A resonator as claimed in claim 8, wherein said non-grain-boundary oxide superconductor layer is fabricated by primary crystals from a liquid phase.

10. A resonator as claimed in claim 6, wherein said non-grain-boundary oxide superconductor layer is comprised of crystals of $RBa_2Cu_3O_x$ having a 123 type crystal structure, said oriented oxide superconductor layer being comprised of crystals of $RBa_2Cu_3O_x$ having an oriented 123 type crystal structure, where R represents Y or one other element of the lanthanide series, x representing an amount of oxygen.

* * * * *

UNITED STATES PATENT AND TRADEMARK OFFICE
CERTIFICATE OF CORRECTION

PATENT NO. : 6,163,713
DATED : December 19, 2000
INVENTOR(S) : Suzuki et al.

It is certified that error appears in the above-identified patent and that said Letters Patent is hereby corrected as shown below:

Title Page, item [73],
Delete "Sumitomo Electric Industries, Ltd."

Signed and Sealed this

Thirty-first Day of July, 2001

Attest:

NICHOLAS P. GODICI
Attesting Officer
Acting Director of the United States Patent and Trademark Office